United States Patent
Seitz et al.

(10) Patent No.: US 10,928,332 B2
(45) Date of Patent: Feb. 23, 2021

(54) INSPECTION DEVICE FOR MASKS FOR SEMICONDUCTOR LITHOGRAPHY AND METHOD

(71) Applicant: Carl Zeiss SMT GmbH, Oberkochen (DE)

(72) Inventors: Holger Seitz, Jena (DE); Thomas Zeuner, Jena (DE); Heiko Feldmann, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 9 days.

(21) Appl. No.: 16/026,197

(22) Filed: Jul. 3, 2018

(65) Prior Publication Data

US 2019/0011376 A1 Jan. 10, 2019

(30) Foreign Application Priority Data

Jul. 10, 2017 (DE) .................... 10 2017 115 365.9

(51) Int. Cl.
*G01N 21/956* (2006.01)
*G03F 7/20* (2006.01)
*G03F 1/84* (2012.01)

(52) U.S. Cl.
CPC ............ *G01N 21/956* (2013.01); *G03F 1/84* (2013.01); *G03F 7/7065* (2013.01);
(Continued)

(58) Field of Classification Search
CPC ........ G01N 21/956; G01N 2021/95676; G03F 7/70575; G03F 1/84; G03F 7/70308; G03F 7/7065
See application file for complete search history.

(56) References Cited

U.S. PATENT DOCUMENTS 5,171,518 A 12/1992 Barshay et al.
5,610,684 A 3/1997 Shiraishi
(Continued)

FOREIGN PATENT DOCUMENTS

DE 102006036504 2/2008 ............ G01B 11/02
DE 112014004139 7/2016 ............ H01S 3/10
(Continued)

OTHER PUBLICATIONS

German Examination Report from the German Patent Office for German Application No. 10 2017 115 365.9 dated Mar. 29, 2018.
(Continued)

*Primary Examiner* — Mohamed K Amara
(74) *Attorney, Agent, or Firm* — Fish & Richardson P.C.

(57) ABSTRACT

The invention relates to an inspection device for masks for semiconductor lithography, comprising an imaging device for imaging a mask, and an image recording device, wherein one or more correction bodies which exhibit a dispersive behavior for at least one subrange of the illumination radiation used for the imaging are arranged in the light path between the mask and the image recording device. The invention furthermore relates to a method for taking account of longitudinal chromatic aberrations in inspection devices for masks, comprising the following steps: recording a specific number of images having differently defocused positions, and selecting a subset of the images and simulating a longitudinal chromatic aberration of a projection exposure apparatus.

28 Claims, 12 Drawing Sheets

(52) U.S. Cl.
CPC ...... *G03F 7/70308* (2013.01); *G03F 7/70575* (2013.01); *G01N 2021/95676* (2013.01)

(56) References Cited

U.S. PATENT DOCUMENTS

| | | | | | |
|---|---|---|---|---|---|
| 6,160,831 | A | * | 12/2000 | Kleinschmidt | G01J 9/00 372/102 |
| 6,606,197 | B2 | * | 8/2003 | Amin | G02B 5/1814 359/618 |
| 8,767,200 | B2 | | 7/2014 | Ogawa et al. | |
| 9,264,606 | B2 | | 2/2016 | Ishihara | |
| 9,601,304 | B2 | | 3/2017 | Khursheed | |
| 9,739,600 | B1 | * | 8/2017 | Fresquet | G01J 3/0218 |
| 9,966,725 | B1 | * | 5/2018 | Teng | G03F 7/7055 |
| 9,997,326 | B2 | * | 6/2018 | Dohi | H01J 37/141 |
| 2002/0071472 | A1 | * | 6/2002 | Dickson | G02B 26/106 372/102 |
| 2003/0095305 | A1 | * | 5/2003 | Kewitsch | G02B 6/29311 398/41 |
| 2003/0164933 | A1 | * | 9/2003 | Nishi | A61K 38/395 355/67 |
| 2003/0168617 | A1 | * | 9/2003 | Goto | B82Y 10/00 250/492.23 |
| 2006/0007554 | A1 | * | 1/2006 | Ferber | G02B 7/008 359/630 |
| 2007/0171547 | A1 | | 7/2007 | Shafer et al. | |
| 2008/0018870 | A1 | * | 1/2008 | Omura | G02B 13/24 355/52 |
| 2008/0031509 | A1 | | 2/2008 | Heiden et al. | |
| 2008/0070133 | A1 | * | 3/2008 | Yang | G03F 7/70625 430/30 |
| 2008/0117400 | A1 | | 5/2008 | Rostalski et al. | |
| 2008/0142681 | A1 | * | 6/2008 | Takizawa | G02B 7/08 250/201.3 |
| 2008/0174786 | A1 | * | 7/2008 | Takizawa | G01J 9/0215 356/521 |
| 2008/0204748 | A1 | * | 8/2008 | Nomaru | B23K 26/04 356/332 |
| 2009/0091715 | A1 | | 4/2009 | Tanaka | |
| 2010/0035167 | A1 | * | 2/2010 | Nagai | G03F 7/70433 430/30 |
| 2011/0134232 | A1 | * | 6/2011 | Raicu | G01J 3/2823 348/79 |
| 2011/0205512 | A1 | | 8/2011 | Seong et al. | |
| 2014/0313498 | A1 | * | 10/2014 | Saenger | G02B 27/281 355/67 |
| 2015/0071316 | A1 | | 3/2015 | Chuang | |
| 2015/0204729 | A1 | * | 7/2015 | Kusunose | G01B 9/02098 356/521 |
| 2017/0184511 | A1 | * | 6/2017 | Den Boef | G03F 9/7065 |
| 2017/0322493 | A1 | * | 11/2017 | Sun | G02B 15/00 |
| 2018/0157177 | A1 | * | 6/2018 | Sun | G03F 7/2004 |
| 2019/0041329 | A1 | * | 2/2019 | Hill | G01J 3/0289 |

FOREIGN PATENT DOCUMENTS

| | | |
|---|---|---|
| JP | 2009-94145 | 4/2009 |
| JP | 2013-142609 | 7/2013 |
| JP | 2015-72155 | 4/2015 |
| JP | 2016-46263 | 4/2016 |
| KR | 10-0360924 | 4/2003 |
| KR | 1020090038121 | 4/2009 |
| KR | 1020130019384 | 2/2013 |
| TW | 2008-13642 | 3/2008 |
| WO | WO 2011/120821 | 10/2011 |

OTHER PUBLICATIONS

Taiwan Office Action and Search Report for Taiwan Application No. 107123710 dated Jan. 3, 2019.

Notice of Reasons for Rejection from the Korean Patent Office for Korean Application No. KR 10-2018-0079927 dated Jan. 16, 2020 (English Translation).

Korean Notice of Reasons for Rejection for Korean Application No. KR 10-2018-0079927 dated Oct. 14, 2020.

* cited by examiner

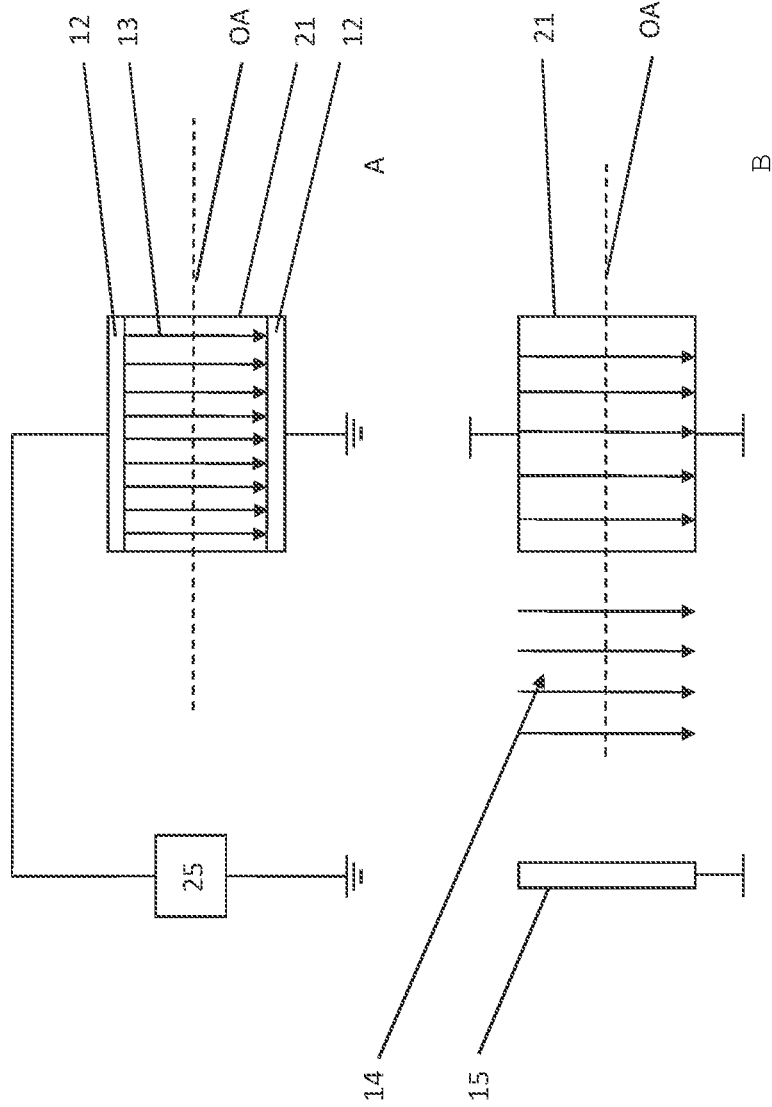

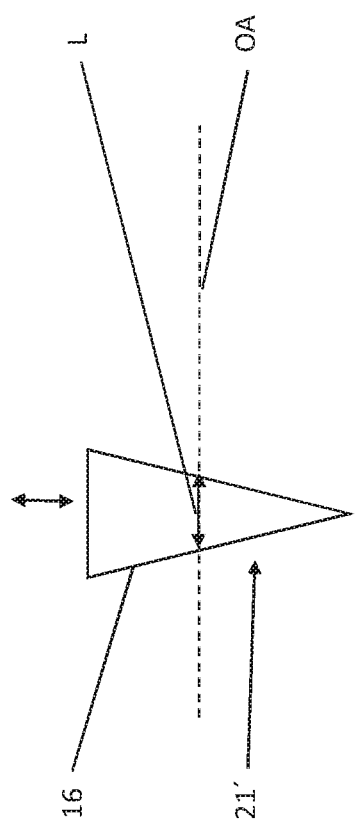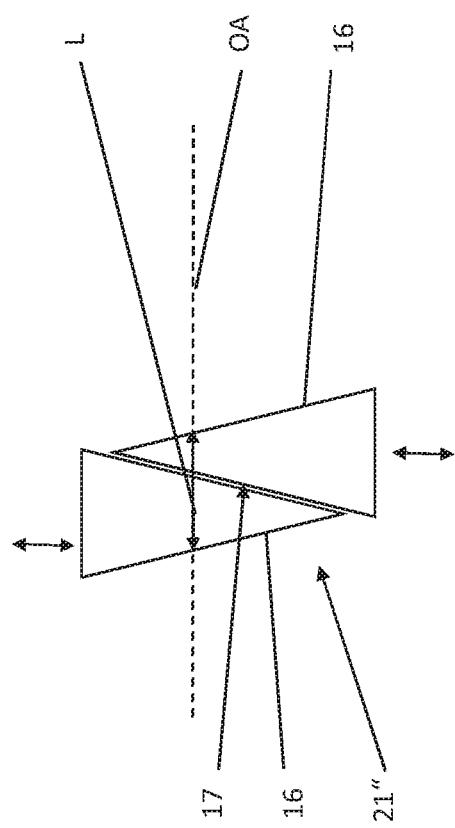

INSPECTION DEVICE FOR MASKS FOR SEMICONDUCTOR LITHOGRAPHY AND METHOD

CROSS REFERENCE TO RELATED APPLICATIONS

This application is a continuation of and claims priority under 35 U.S.C. § 119 from German Application No. DE 10 2017 115 365.9, filed on Jul. 10, 2017, the entire contents of which is incorporated herein by reference in its entirety.

TECHNICAL FIELD

The invention relates to an inspection device for masks for semiconductor lithography and to a corresponding method. Masks of this type are generally used to image structures situated on them generally in a manner reduced by a scale of 1:4 onto light-sensitive layers on a semiconductor substrate, a so-called wafer, by use of a projection lens of a projection exposure apparatus, a so-called scanner. This technology makes it possible to create extremely small structures on the semiconductor substrate and in this way to realize large scale integrated electronic circuits.

BACKGROUND

In order to increase the performance of the fabrication process, it is advantageous for the masks to be subjected to an examination or inspection process as early as before their use in a scanner or at regular intervals including after removal for maintenance. For this purpose, use is usually made of inspection devices for masks which, by use of a microscope-like arrangement, image the masks in a magnifying manner and make defects identifiable in this way. Measuring systems of this type are usually also referred to as "aerial image measuring systems" and are known commercially by the designations AIMS or WLCD (wafer-level critical dimension). They are usually able to simulate to a certain degree the conditions during real use of the mask in a scanner, such as, in particular, the illumination setting and the imaging setting; for example sigma shape, numerical aperture and polarization. However, depending on the respective manufacturer or the year of construction, different scanners have different so-called longitudinal chromatic aberrations that influence the behavior of the overall system. A longitudinal chromatic aberration is understood to mean the phenomenon that, on account of the dispersive behavior of the optical materials used, the imaging of a wafer by the projection lens lies in planes that deviate slightly from one another for deviating wavelengths; in other words: the position of the best focus of the imaging can vary with the wavelength. On account of the finite spectral width of the electromagnetic radiation used (generally having a wavelength of approximately 193 nm, but radiation having a wavelength deviating therefrom, for example EUV radiation having a wavelength in the range of 10 nm-121 nm, in particular in the region of 13.5 nm, is also used), the effect mentioned leads to a non-negligible image unsharpness. The prior art hitherto has not yet disclosed any methods which can be used to simulate the longitudinal chromatic aberration in an inspection device for masks.

SUMMARY

In a general aspect, the present invention specifies a method and a device by use of which the longitudinal chromatic aberration of a scanner for the measurement of a mask in an inspection device for masks can be taken into account in an improved way by comparison with the solutions known from the prior art.

In another general aspect, an inspection device for masks for semiconductor lithography is provided. The inspection device comprises an imaging device for imaging a mask, and an image recording device. One or more correction bodies that exhibit a dispersive behavior for at least one subrange of the illumination radiation used for the imaging are arranged in the light path between the mask and the image recording device.

In another general aspect, a method for taking account of longitudinal chromatic aberrations in inspection devices for masks is provided. The method includes the following steps: recording a specific number of images having differently defocused positions, and selecting a subset of the images and simulating a longitudinal chromatic aberration of a projection exposure apparatus.

The inspection device according to the invention for masks for semiconductor lithography comprises an imaging device for imaging a mask, and an image recording device. The imaging device is, e.g., a microscope objective. The image recording device can be for example a CCD camera, CMOS-camera or linear-array camera with associated optics. According to the invention, one or more correction bodies which exhibit a dispersive behavior for at least one subrange of the illumination radiation used for the imaging are arranged in the light path between the mask and the image recording device.

The correction body advantageously contains a medium which is dispersive in the wavelength range of interest, such as, for example, calcium fluoride or quartz glass.

Since the imaging device is typically configured as a transmitted-light microscope, said correction body is usually situated on a side of a mask facing away from the radiation source in the light path between the mask and the image recording device. In this case, the correction body can be arranged between the mask and the imaging device or between the imaging device and the image recording device. It is also possible for the correction body to be arranged between a radiation source and an illumination unit for the mask. Furthermore, the correction body can be arranged between an illumination unit for the mask and the mask itself. In a further variant, the correction body can be arranged within the illumination unit for the mask or within the imaging device. It goes without saying that it is possible that, in the case where a plurality of correction bodies are used, the correction bodies can be arranged at a plurality of the positions mentioned above.

In this case, the correction body has the effect of simulating, on account of its dispersive properties, the behavior of the likewise dispersive media in projection lenses of scanners. On account of the comparatively few, thin optical elements in the microscope objective of the inspection device, the longitudinal chromatic aberration, as already mentioned, is not adequately simulated without additional measures, and so the correction body mentioned can provide a remedy here. This is the case in particular also because the used radiation that is used in the projection lenses mentioned covers considerably longer optical paths in the dispersive materials of the optical elements of the projection lens than in the inspection device.

One advantage of the present invention here is that various longitudinal chromatic aberrations can be set, such that the different longitudinal chromatic aberrations of diverse projection systems can be taken into account.

In this case, the dispersive behavior of the correction body need not necessarily be static, but rather can be configured as dynamically selectable by external influencing. In this regard, firstly, in a manner known per se, the dispersion behavior of a correction body can be influenced for example by the action of a mechanical stress. Likewise, the presence of an electric, magnetic or electromagnetic field in the region of the correction body can also influence the dispersive properties thereof in the desired way. Furthermore, it is possible to influence the dispersive behavior of the correction body by use of thermal stresses, e.g. by use of a heating element or a Peltier element or by use of the pressure or the gas composition of the environment in which the correction body is arranged. It goes without saying that it is conceivable to utilize all the effects mentioned in parallel or else simultaneously for influencing the dispersive behavior of the correction body by use of corresponding configuration of the device according to the invention.

Furthermore, there is the possibility of varying the influence of the dispersive material of the correction body by altering the spatial orientation, position or shape of the correction element. In this regard, by way of example, a correction body of variable thickness can be used. This can be achieved, for example by use of a wedge-shaped correction body that can be displaced transversely with respect to the light path. Furthermore, two wedges sliding on their respective wedge surfaces can also be used.

All the measures mentioned above have in common the advantage that, by use of a suitable choice of the constitution of the material of the correction body and/or by use of the suitable thermal, mechanical or else electrical driving thereof, a simulation of the conditions in a wide variety of scanners can be achieved and the behavior of the masks to be inspected in the respective target systems can thus be better calculated in advance.

A method according to the invention that is alternatively or additionally usable for taking account of longitudinal chromatic aberrations in inspection devices for masks is described below.

One possible advantage of this method is that the effect of the longitudinal chromatic aberration can be explicitly measured. This can be used to perform further adaptations and/or optimizations. This can concern both lithography parameters such as exposure settings or etching processes and design stipulations for the mask.

In a first step, firstly a focus stack is measured; that is to say that a specific number of images having a differently defocused position are recorded. These images can then be used to simulate a longitudinal chromatic aberration, which in its nature likewise acts like a focus aberration. In this regard, by way of example, it is possible to measure 5 planes at a distance of 100 nm with respect to the mask. With knowledge of the line width of the used radiation and the longitudinal chromatic aberration of the projection exposure apparatus, from the individual images of the focus stack it is then possible to select those images which are closest to that image which would correspond to the image in the scanner. The longitudinal chromatic aberration of the scanner can then be simulated by suitable interpolation and, if appropriate, weighting of the images.

The step size of the defocusing can also be configured fixedly, e.g. be divided into a main step size and a secondary step size. In this regard, by way of example, it is possible to choose a main step size of 0.8-1.2, in particular of 1, μm with respect to the mask and a secondary step size of 80-120, in particular of 100, nm with respect to the mask.

In other words, the main step size addresses focus aberrations in the scanner which are process-specific, that is to say stem for example from a wafer flexure or the situation where the mask is not situated at the best focus. These—usually situation-dependent—focus aberrations add up to form the known longitudinal chromatic aberration of the scanner respectively considered.

The secondary step size makes it possible to further improve the accuracy of the assignment of a defocusing of the measuring microscope to defocusings of the mask or of the wafer (as a sum of scanner-specific longitudinal chromatic aberration and situation-dictated deviation from the best-focus position in the scanner) for every assumed situation in the scanner in particular by use of interpolation.

With the aid of the main step size, it is then possible to assess the process window (structure width versus defocus depending on the exposure dose) of structures, and/or the imaging behavior of defects.

BRIEF DESCRIPTION OF DRAWINGS

Exemplary embodiments and variants of the invention are explained in greater detail below with reference to the drawing. In the figures:

FIGS. 5A and 5B show two variants for influencing a correction body by use of electromagnetic fields and waves.

FIGS. 6A and 6B show two possible embodiments for setting the length of the path of the optical radiation within a correction body.

DETAILED DESCRIPTION

Figure 1:
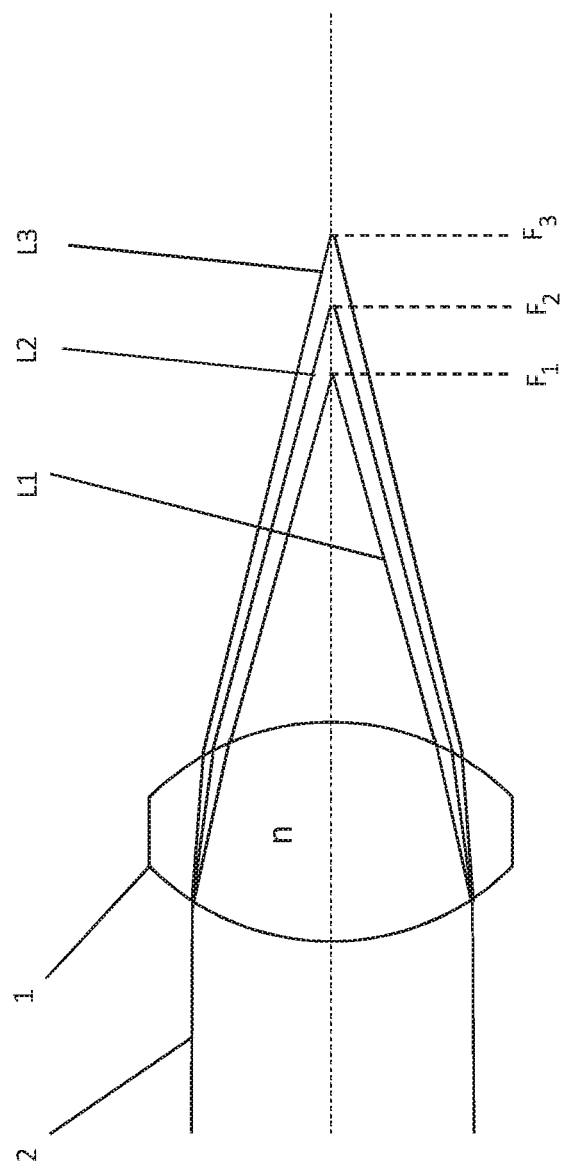
FIG. 1 shows a schematic illustration of the longitudinal chromatic aberration of an optical lens element.

FIG. 1 illustrates a schematic illustration of the longitudinal chromatic aberration of an optical lens element 1 on account of the chromatic aberration. The electromagnetic radiation 2 having a bandwidth that is finite, but by its nature different than zero, is refracted to varying extents within the optical lens element 1 on account of the wavelength-dependent refractive index n of the optical lens element 1, thus resulting in different focal planes F1, F2, F3. By way of example, the illustration shows three wavelengths L1, L2, L3 of the electromagnetic radiation 2 with the corresponding focal planes F1, F2, F3, wherein L1<L2<L3 holds true. On account of the wavelength dependence of the refractive index n and thus the focal planes F1, F2, F3, this is referred to as a longitudinal chromatic aberration. A feature of the invention to integrate this actually undesired optical aberration in a targeted manner within an inspection device for masks in order to be able to simulate various projection exposure apparatuses with characteristic longitudinal chromatic aberrations. In this case, according to the invention, one or more correction bodies are used for influencing the dispersive behavior.

Figure 2:
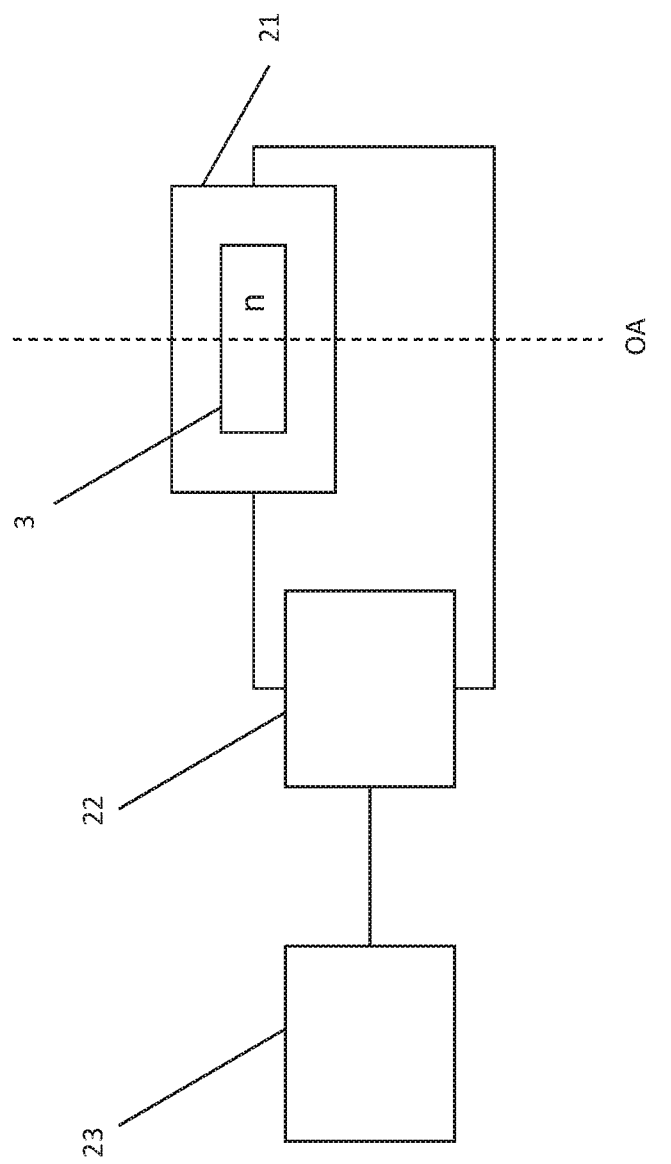
FIG. 2 shows a schematic illustration of the construction of a correction body for the targeted influencing of the dispersive behavior of an inspection device for masks.

FIG. 2 illustrates, in a schematic illustration, the construction of one exemplary correction body 21 for the targeted influencing of the chromatic aberration. In this case, the correction body 21 comprises an optical dispersion medium 3, for example calcium fluoride or quartz glass, wherein the optical axis OA of an inspection device for masks 4 extends through the dispersion medium 3. Via a dispersion control mechanism 22, the dispersive property of the dispersion medium 3 of the correction body 21 is influenced in a targeted manner in order to generate a specific longitudinal chromatic aberration. In this case, the optical medium 3 can be influenced statically and also dynamically. For the targeted control and regulation of the longitudinal chromatic aberration, the dispersion control mechanism 22 is controlled via an electronic control unit 23.

Figure 3:
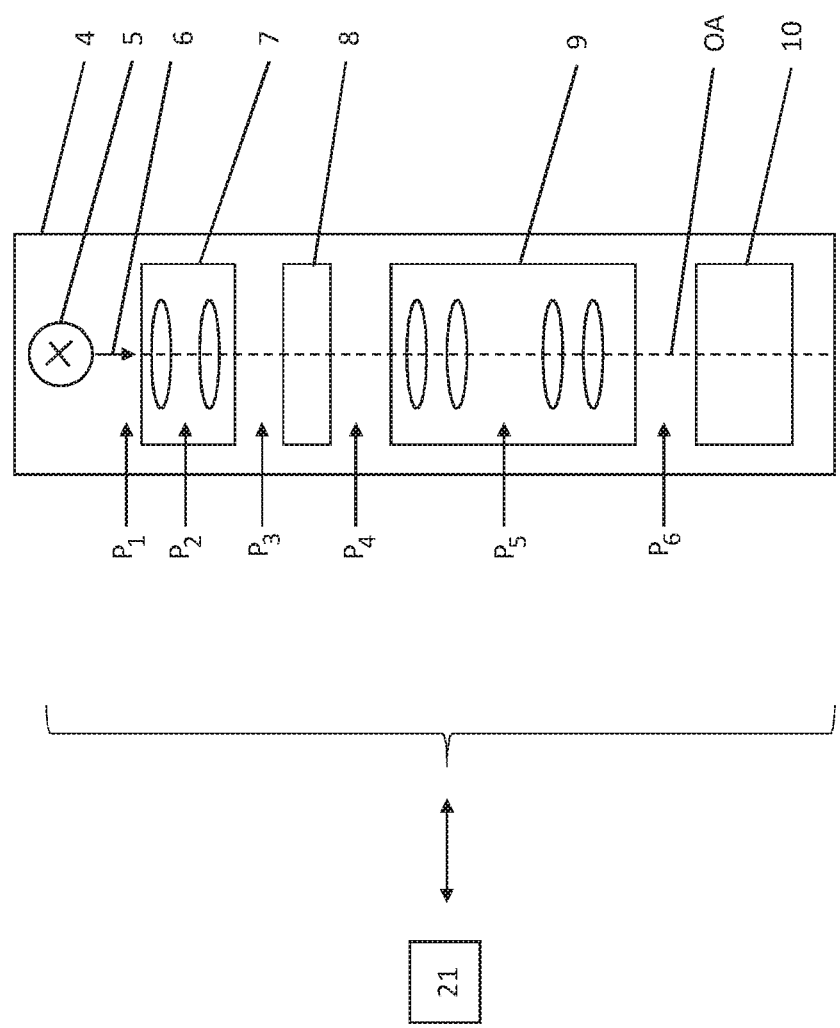
FIG. 3 shows a schematic illustration of the inspection device according to the invention for masks with possible arrangements of the position of a correction body for the targeted setting of a specific longitudinal chromatic aberration.

FIG. 3 shows a schematic illustration of the device according to the invention of an inspection device for masks 4 with possible positions (P1, P2, P3, P4, P5, P6) of one or more correction bodies 21 for the targeted setting of a specific longitudinal chromatic aberration. The inspection device for masks 4 comprises a radiation source 5 for generating electromagnetic illumination radiation 6 along the optical axis OA of the inspection device for masks 4. In this case, by way of example, an electromagnetic illumination radiation 6 having a wavelength of 193 nm is conceivable. The electromagnetic illumination radiation 6 is guided via an illumination unit 7 onto the mask 8 to be inspected. By use of the imaging device 9, the electromagnetic illumination radiation 6 is imaged onto a camera 10 and detected there, wherein the camera 10 can be configured for example as a CCD, CMOS or linear-array camera. The recorded signal is subsequently processed electronically in a data processing unit (not illustrated in the figure).

The possible positions P1, P2, P3, P4, P5, P6 of one or more correction bodies 21 are in particular: position P1 between radiation source 5 and illumination unit 7, position P2 within the illumination unit 7, position P3 between illumination unit 7 and mask 8, position P4 between mask 8 and imaging device 9, position P5 within the imaging device 9, and position P6 between imaging device 9 and camera 10.

A plurality of correction bodies 21 can also be arranged for each position. It is also conceivable for a system comprising a plurality of correction bodies 21 to be integrated at different positions within the inspection device for masks 4, wherein a plurality of correction bodies 21 can be arranged for each position.

Figure 4:
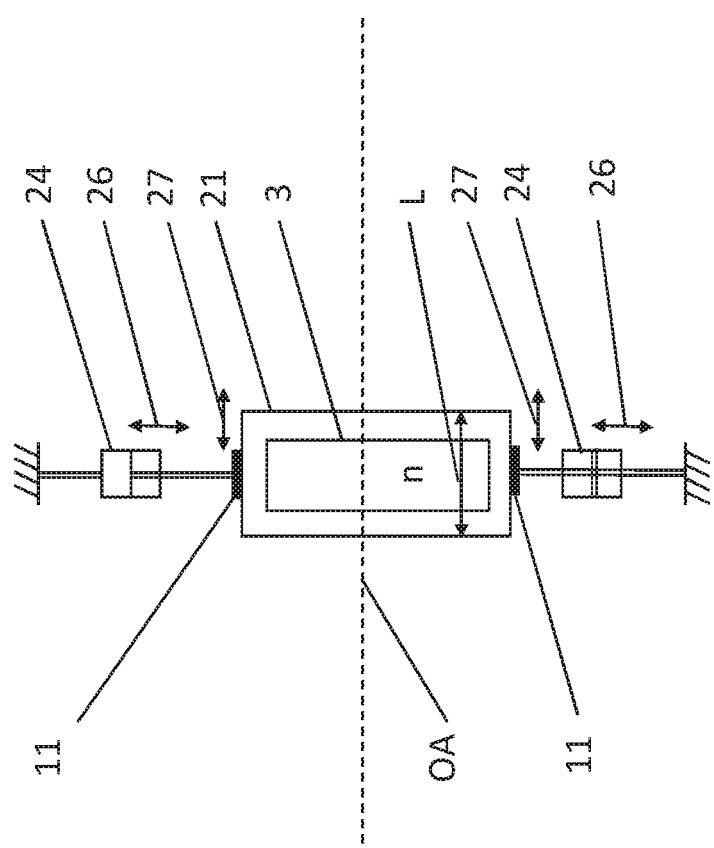
FIG. 4 shows one variant for mechanically influencing a correction body.

FIG. 4 illustrates one variant for mechanically influencing a correction body 21. In this case, the correction body 21 is clamped in via two actuator contact surfaces 11 extending parallel to the optical axis OA. By use of the actuators 24, via the actuator contact surfaces 11 a mechanical force can be introduced perpendicularly to the optical axis OA into the correction body 21. It is likewise possible for the actuators 24 to move separately in the arrow direction 27 parallel to the optical axis OA, as a result of which the force vectors 26 of the actuators 24 can act on the correction body 21 in opposite directions and in a spatially offset manner. By use of the actuators 24 as mechanical influencing mechanism, it is thus possible to bring about tensile and compressive forces, torques and also mechanical stresses of arbitrary type statically and also dynamically in the correction body 21, as a result of which the refractive index n of the dispersion medium 3 and thus the dispersive behavior of the correction body 21 can be controlled. It is conceivable for the correction body 21 to be fixedly clamped in place and for the force impression to be effected only via an actuator 24. It is likewise possible for a change in the geometry of the dispersion medium 3 of the correction body 21 to be effected by use of a compressive or tensile force, as a result of which the optical path length L of the optical radiation within the correction body 21 can additionally be influenced in a targeted manner. By way of example, electrical, hydraulic, pneumatic, thermal and magnetic actuators are conceivable as actuators 24. Furthermore, it is possible to use piezo-actuators or acousto-optical modulators for modulating the refractive index n of the correction body 21 by use of mechanical mechanisms. Furthermore, instead of actuators 24, it is also possible to use kinematics, in particular in the case of static influencing.

FIGS. 5A and 5B show two variants for influencing a correction body 21 by use of electromagnetic fields and/or waves. In this case, in variant A, an electric field 13 is impressed within the dispersion medium 3 of the correction body 21 via two electrical contact pads 12. The electric field 13 is controlled statically and dynamically via a voltage generator 25. The acting electric field 13 influences the dispersive behavior of the correction body 21, as a result of which different longitudinal chromatic aberrations can be generated in a targeted manner. By way of example, the refractive index n of the dispersion medium 3 is modulated in a targeted manner via the electromagnetic field 13 by use of linear effects, such as the Pockels effect or the Kerr effect, or by use of nonlinear optical effects. An alternative embodiment is shown in variant B, wherein the electromagnetic radiation 14 is impressed into the dispersion medium 3 within the correction body 21 by use of an emitter 15.

FIGS. 6A and 6B illustrate two possible embodiments for setting the optical path length L within a correction body. In this case, a correction body 21' in the form of an optical wedge 16 is illustrated in the variant illustrated in FIG. 6A. The optical path length L within the correction body 21' can be set by use of a displacement of the optical wedge 16 perpendicularly to the optical axis OA. A correction body 21" in the form of an arrangement of two optical wedges 16 having a similar functional principle is illustrated in the variant shown in FIG. 6B. In this case, the two optical wedges 16 can be displaced, such that they slide on their respective wedge surfaces 17 and thus cause a change in the optical path length L. It is likewise conceivable that more than two optical wedges 16 can be used.

Figure 7:
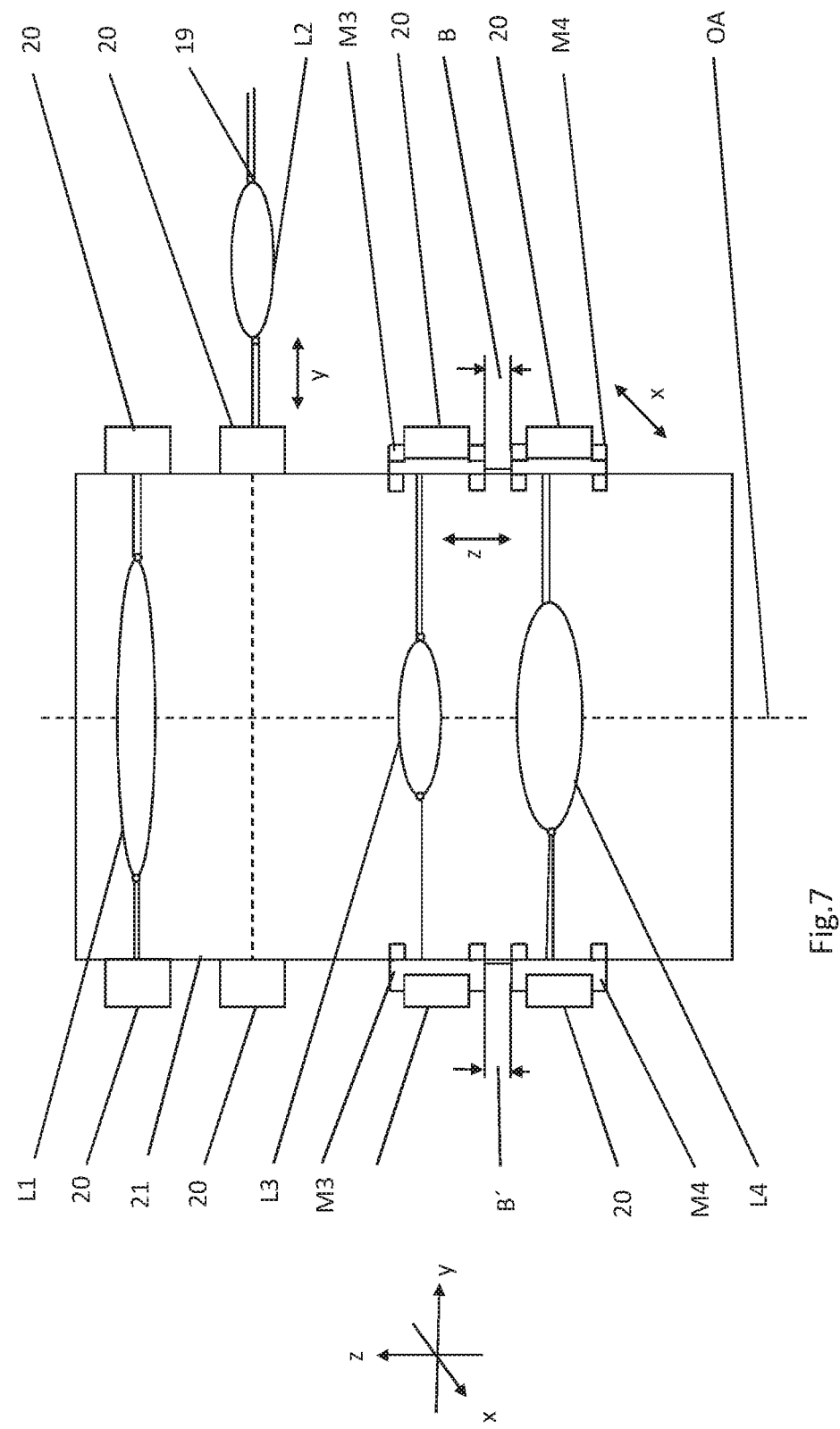
FIG. 7 shows one embodiment for changing the spatial orientation and position of a correction body.

FIG. 7 shows one embodiment for changing the spatial orientation and position of correction bodies. In this case, optical lens elements L1, L2, L3, L4 are arranged along the optical axis OA within a correction body 21. The optical lens elements L1, L2, L3, L4 are positioned mechanically within the correction body 21 by use of a lens element fixing 19 and a lens element mount 20. The dispersive behavior can be influenced firstly via an insertion and withdrawal of the optical lens element L2 since a different longitudinal chromatic aberration exists depending on the presence of the optical lens element L2 within the correction body 21. In this case, the optical lens element L2 can be changed depending on the desired chromatic aberration, e.g. by use of a lens element turret. The optical lens element L3 and the optical lens element L4 are able to be mechanically freely arranged three-dimensionally and also rotationally about their axes in the identified coordinate system in x-y-z-direction. In this case, the lens elements L3, L4 can assume different degrees of freedom separately by use of their respective mechanism M3, M4. Firstly, the lens elements L3, L4 can be displaced by use of the mechanism M3, M4 separately in x-y-z-direction at their respective lens element mounts 20. Furthermore, each lens element L3, L4 can be rotated about the x-y and z-axis. The lens elements L3, L4 can likewise be mutually tilted, if for example the distances B' and B are chosen to be different by use of the mechanisms M3, M4. By use of the different settable spatial orientations and positions of the optical lens element L3 and of the optical lens element L4, different longitudinal chromatic aberrations can thus be set and simulated within the inspection device for masks 4.

Figure 8:
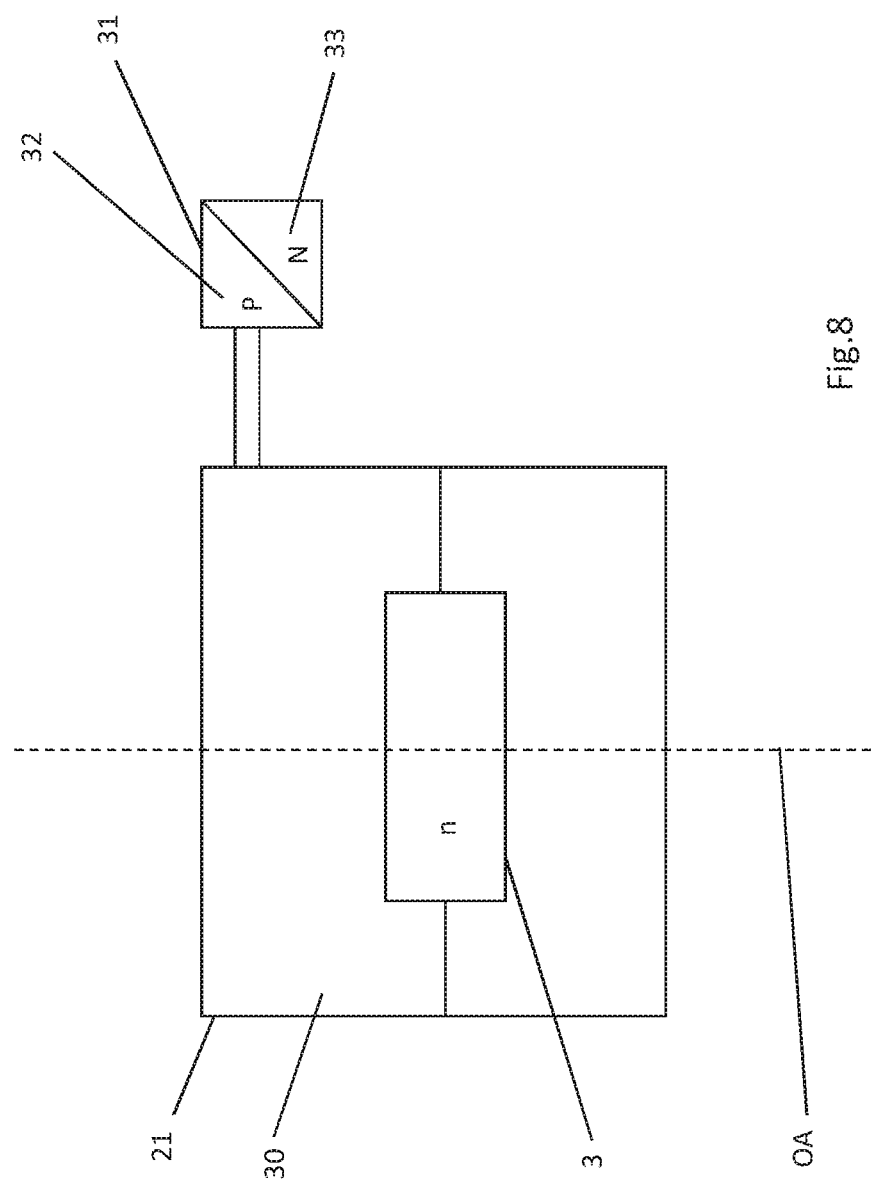
FIG. 8 shows one variant for influencing the correction body by way of the gas pressure and the gas composition of the environment.

FIG. 8 illustrates one variant for influencing the correction body by way of the gas pressure and the gas composition of the environment. In this case, the dispersion medium 3 of the correction body is situated within a controllable gaseous environment 30. Via a purge gas unit 31, it is possible to influence the pressure P via a pressure regulation 32 and the composition of the gas N via the gas component regulation 33. By way of example, the gaseous environment uses nitrogen, which can be enriched in a controlled environment by use of noble gas additives. On account of the action of the gaseous environment directly on the dispersion medium 3, the dispersive behavior of the correction body can be influenced in a targeted manner.

Figure 9E:
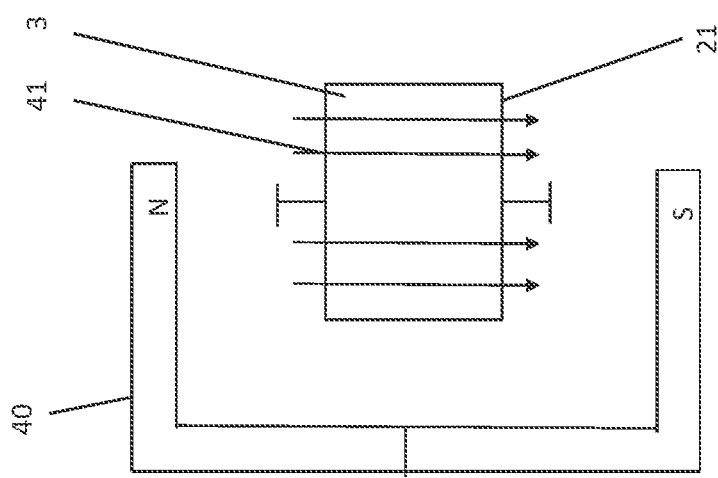
FIGS. 9E, 9F, and 9G show three variants for influencing a correction body by use of magnetic fields.
Figure 9F:
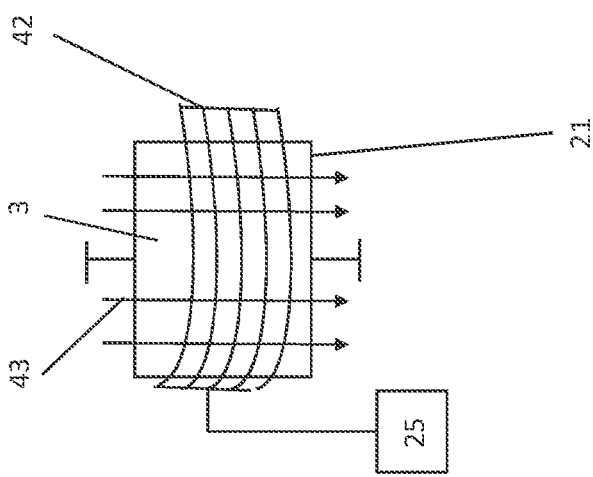
Figure 9G:
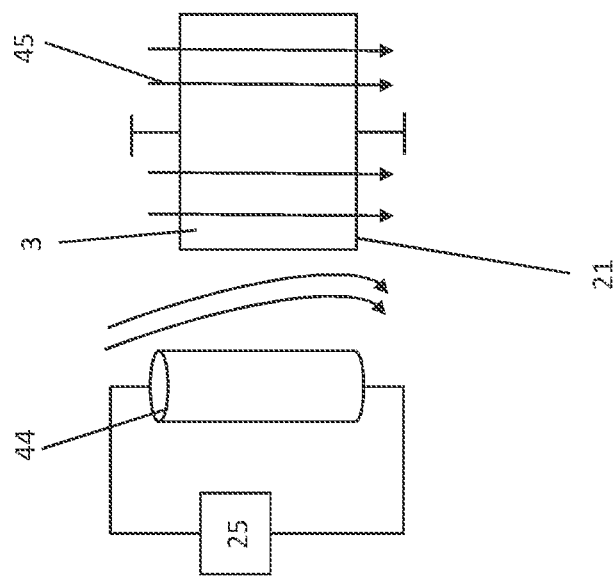

FIGS. 9E, 9F, and 9G show three variants for influencing a correction body 21 by use of magnetic fields. In this case, in variant E, a magnetic field 41 can be impressed within the dispersion medium 3 of the correction body 21 by use of a permanent magnet 40. As further variant F, a coil 42 can be wound around the correction body 21 and the dispersion medium 3 thereof in order to build up a magnetic field 43. The coil 42 and the magnetic field 43 are influenced statically and also dynamically via a voltage generator 25. An electromagnet 44 is likewise conceivable as variant G, said electromagnet being controlled via a voltage generator 25 for generating the magnetic field 45.

Figure 10:
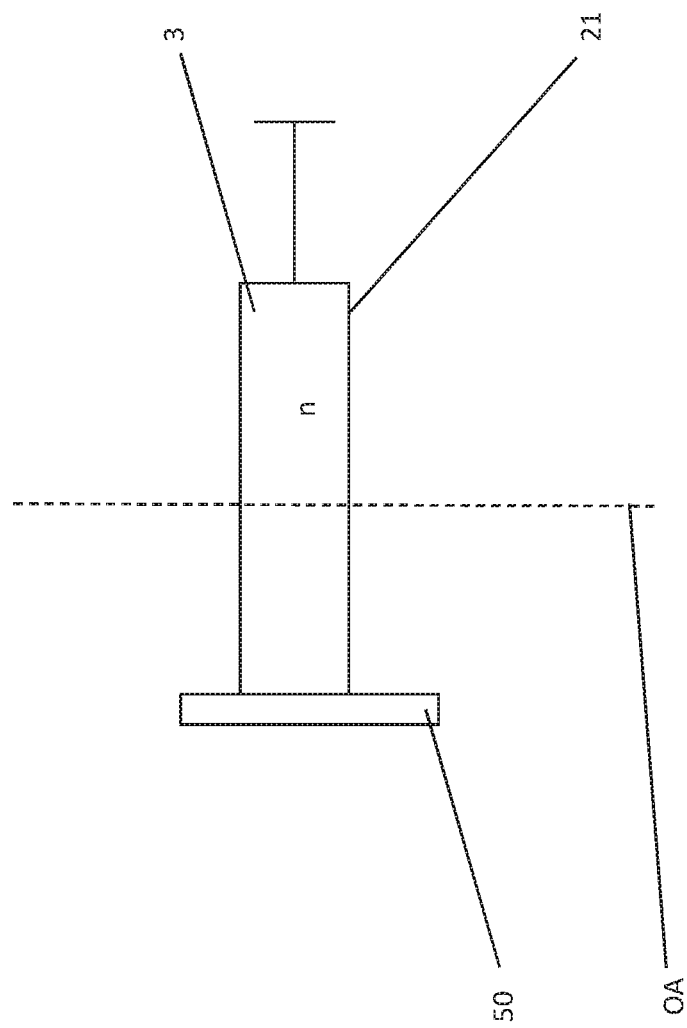
FIG. 10 shows one embodiment for thermally influencing a correction body.

FIG. 10 illustrates one embodiment for influencing a correction body 21 by use of a thermal element 50. In this case, the dispersion medium 3 of the correction body 21 is influenced thermally by a heating element 50, e.g. a Peltier element such that a temperature change arises within the dispersion medium 3. On account of the temperature dependence of the reflective index n, the dispersive behavior of the correction body 21 is influenced and a specific longitudinal chromatic aberration thus occurs.

Figure 11:
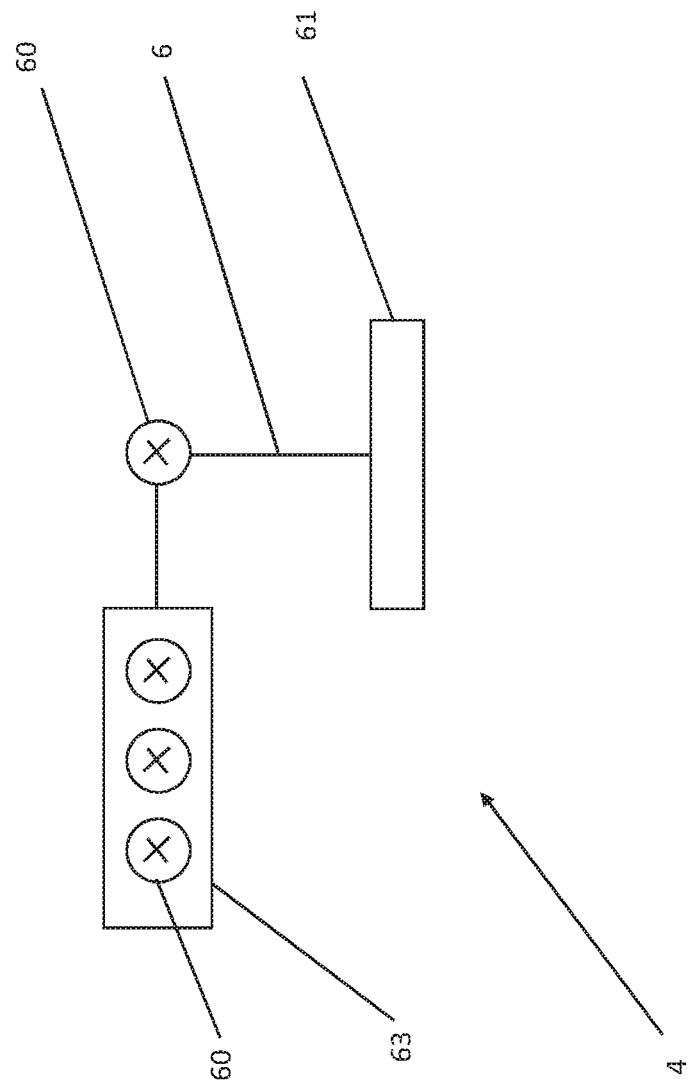
FIG. 11 shows one variant for changing the spectral properties of the radiation source of the inspection device for masks for the targeted setting of a longitudinal chromatic aberration.

FIG. 11 illustrates one variant for changing the spectral properties of the radiation source of the inspection device for masks 4 for the targeted setting of a longitudinal chromatic aberration. In this case, the electromagnetic illumination radiation 6 of the spectral source 60 can be spectrally influenced via an optical filter system 61. An optical radiation source that is tunable in terms of its spectral property, e.g. a spectrally tunable LED, is conceivable a spectral source 60, as a result of which it is possible to introduce wavelength-selectively different longitudinal chromatic aberrations in the inspection device for masks 4. Furthermore, a spectral source collective 63 comprising various spectral sources 60 having different spectral properties, e.g. in the form of an array, is conceivable, wherein selectively one spectral source 60 from the spectral source collective 63 is introduced into the beam path. Consequently, it is possible to simulate different projection exposure apparatuses and the longitudinal chromatic aberrations thereof within the inspection device for masks 4.

Figure 12:
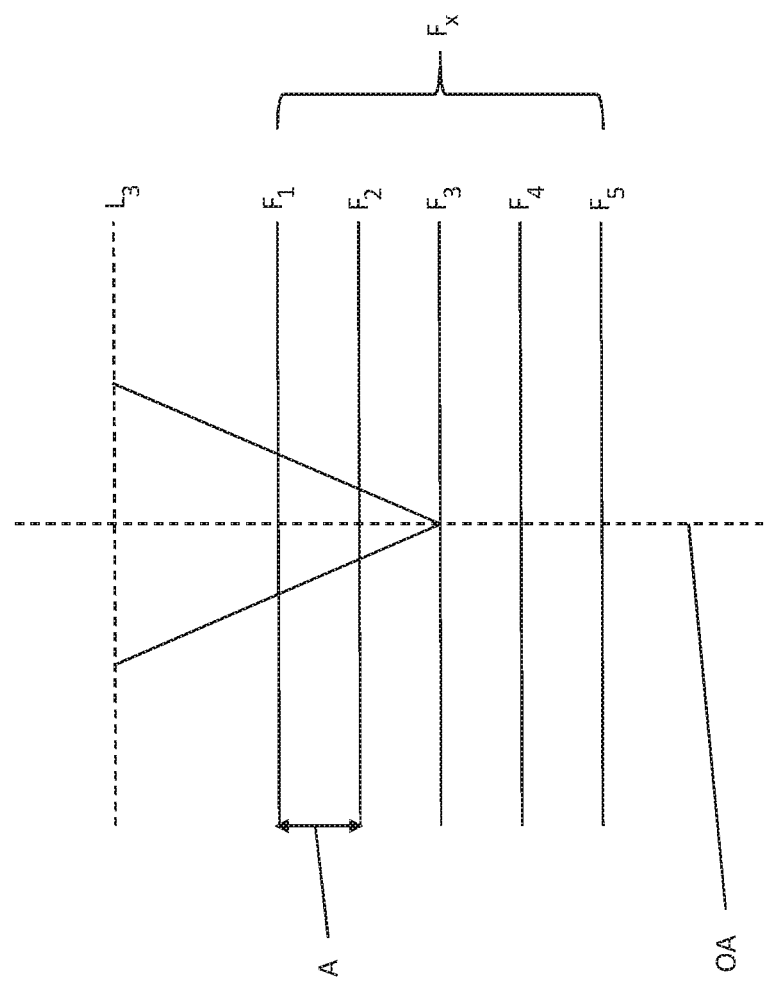
FIG. 12 shows a schematic illustration of a method for simulating a longitudinal chromatic aberration by use of recording a focus stack.

FIG. 12 shows, in a schematic illustration, a method for simulating a longitudinal chromatic aberration by use of recording a focus stack Fx. This involves recording for example 5 planes (F1, F2, F3, F4, F5) at a distance A of 100 nm in a defocused position. For this purpose, firstly the camera and also the imaging device of the inspection device for masks can be adapted variably for each recording. The focusing of a principal plane L3 onto its corresponding focal plane F3 is illustrated by way of example. With knowledge of the line width of the used radiation and the longitudinal chromatic aberration of projection exposure apparatus to be simulated, from the individual images of the focus stack Fx it is then possible to select those images which would correspond to the longitudinal chromatic aberration to be simulated. The longitudinal chromatic aberration can then be simulated by suitable interpolation and, if appropriate, weighting of the images.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results.

LIST OF REFERENCE SIGNS

1 Optical lens element
2 Electromagnetic radiation
3 Dispersion medium
4 Inspection device for masks
5 Radiation source
6 Illumination radiation
7 Illumination unit
8 Mask
9 Imaging device
10 Camera
11 Actuator contact surfaces
12 Electrical contact pad
13 Electric field
14 Electromagnetic radiation
15 Emitter
16 Optical wedge
17 Wage surfaces
19 Lens element fixing
20 Lens element mount
21 Correction body
22 Dispersion control mechanism
23 Control unit 24 Actuator
25 Voltage generator
26 Force vector
27 Direction parallel to the optical axis
A Distance of focal plane
OA Optical axis
F1 . . . F5 Focal plane
L1 . . . L3 Wavelength
N Gas composition
N Refractive index
P Pressure
Fx Focus stack
P1 . . . P6 Possible positions of the correction body
30 Gaseous environment
31 Purge gas unit
32 Pressure regulation
33 Gas component regulation
40 Permanent magnet
41 Magnetic field of permanent magnet
42 Coil
43 Magnetic field of coil
44 Electromagnet
45 Magnetic field of electromagnet
50 Heating element
60 Spectral source
61 Optical filter
63 Spectral source collective

What is claimed is:

1. An inspection device for masks for semiconductor lithography, comprising:
    an imaging device for imaging a mask for semiconductor lithography, in which the imaging device includes one or more lenses;
    an image recording device, in which the imaging device is configured to project a focused image of the mask onto the image recording device for at least one wavelength of illumination radiation that is used to illuminate the mask;
    one or more correction bodies comprising one or more optical dispersion media which exhibit a dispersive behavior for at least one subrange of the illumination radiation used for imaging the mask, in which the one or more correction bodies are arranged in a light path between the mask and the image recording device, and the one or more correction bodies do not contribute to a desired imaging effect of the imaging device; and
    means for controllably influencing the dispersive behavior of at least one of the one or more correction bodies.

2. The device as claimed in claim 1, wherein one or more of the one or more correction bodies are arranged between the mask and the imaging device.

3. The device as claimed in claim 1, further comprising additional one or more correction bodies that are arranged between an illumination unit for the mask and the mask.

4. The device as claimed in claim 1, further comprising additional one or more correction bodies that are arranged between a radiation source and an illumination unit for the mask.

5. The device as claimed in claim 1, wherein one or more of the one or more correction bodies are arranged between the imaging device and the image recording device.

6. The device as claimed in claim 1, further comprising additional one or more correction bodies that are arranged within an illumination unit for the mask.

7. The device as claimed in claim 1, wherein the one or more correction bodies comprise at least one of calcium fluoride or quartz glass.

8. The device as claimed in claim 1, wherein the means for influencing the dispersive behavior of the at least one of the one or more correction bodies is configured to bring about mechanical stresses in the at least one of the one or more correction bodies.

9. The device as claimed in claim 1, wherein the means for influencing the dispersive behavior of the at least one of the one or more correction bodies is configured to generate electric fields in the region of the at least one of the one or more correction bodies.

10. The device as claimed in claim 1, wherein the means for influencing the dispersive behavior of the at least one of the one or more correction bodies is configured to generate magnetic fields in the region of the at least one of the one or more correction bodies.

11. The device as claimed in claim 1, wherein the means for influencing the dispersive behavior of the at least one of the one or more correction bodies is configured to generate electromagnetic fields in the region of the at least one of the one or more correction bodies.

12. The device as claimed in claim 1, wherein the means for influencing the dispersive behavior of the at least one of the one or more correction bodies is configured to bring about thermal stresses in the at least one of the one or more correction bodies.

13. The device as claimed in claim 1, wherein the means for influencing the dispersive behavior of the at least one of the one or more correction bodies is configured to influence the pressure and the gas composition of the environment in which the at least one of the one or more correction bodies is arranged.

14. The device as claimed in claim 1, wherein the at least one of the one or more correction bodies comprises means for influencing the length of the path of the illumination radiation used for the inspection.

15. The device as claimed in claim 14, wherein the at least one of the one or more correction bodies comprises one or more optical wedges which are displaceable relative to an optical axis of the inspection device for masks.

16. The device as claimed in claim 15, wherein at least two optical wedges are arranged displaceably along their respectively opposite wedge surfaces.

17. The device as claimed in claim 1, wherein the at least one of the one or more correction bodies comprises means for changing the spatial orientation or position of optical elements in the at least one of the one or more correction bodies.

18. The device as claimed in claim 17, wherein the means for changing the spatial orientation or position of optical elements in the at least one of the one or more correction bodies is configured to alter the distance between the optical elements.

19. The device as claimed in claim 17, wherein the means for changing the spatial orientation or position of optical elements in the at least one of the one or more correction bodies is configured to displace the optical elements perpendicularly to an optical axis of the inspection device for masks.

20. The device as claimed in claim 1, comprising means for spectrally influencing the illumination radiation.

21. The device of claim 1 in which the imaging device includes two or more optical elements, and at least one of the one or more correction bodies is arranged between two of the two or more optical elements of the imaging device along a path of the illumination radiation.

22. An inspection device for masks for semiconductor lithography, the inspection device comprising:

an imaging device for imaging a mask, in which the imaging device comprises one or more lenses;
an image recording device;
one or more correction bodies comprising one or more optical dispersion media that exhibit a dispersive behavior for at least one subrange of an illumination radiation used for imaging the mask, in which the one or more correction bodies are arranged in a light path between the mask and the image recording device, and the one or more correction bodies do not contribute to a desired imaging effect of the imaging device; and
a dispersion control device configured to controllably influence the dispersive behavior of at least one of the one or more correction bodies, including at least one of (i) mechanically influence the dispersive behavior of the at least one of the one or more correction bodies, (ii) electrically influence the dispersive behavior of the at least one of the one or more correction bodies, (iii) magnetically influence the dispersive behavior of the at least one of the one or more correction bodies, (iv) electromagnetically influence the dispersive behavior of the at least one of the one or more correction bodies, (v) thermally influence the dispersive behavior of the at least one of the one or more correction bodies, (vi) influence a pressure of the environment in which the at least one of the one or more correction bodies is arranged, or (vii) influence a gas composition of the environment in which the at least one of the one or more correction bodies is arranged.

23. The inspection device of claim 22, comprising an electronic control unit configured to control the dispersion control device.

24. An inspection device for masks for semiconductor lithography, the inspection device comprising:
an imaging device for imaging a mask, in which the imaging device comprises one or more lenses;
an image recording device;
one or more correction bodies comprising one or more optical dispersion media that exhibit a dispersive behavior for at least one subrange of an illumination radiation used for imaging the mask, in which the one or more correction bodies are arranged in a light path between the mask and the image recording device, and the one or more correction bodies do not contribute to a desired imaging effect of the imaging device; and
a dispersion control device configured to controllably influence the dispersive behavior of at least one of the one or more correction bodies.

25. The inspection device of claim 24 in which the dispersion control device is configured to at least one of:
(i) dynamically bring about mechanical stresses in the at least one of the one or more correction bodies,
(ii) dynamically generate electric fields in the region of the at least one of the one or more correction bodies,
(iii) dynamically generate magnetic fields in the region of the at least one of the one or more correction bodies,
(iv) dynamically generate electromagnetic fields in the region of the at least one of the one or more correction bodies,
(v) dynamically bring about thermal stresses in the at least one of the one or more correction bodies,
(vi) dynamically influence a pressure of an environment in which the at least one of the one or more correction bodies is arranged, or
(vii) dynamically influence a gas composition of an environment in which the at least one of the one or more correction bodies is arranged.

26. The inspection device of claim 24, comprising an electronic control unit configured to control the dispersion control device.

27. An inspection device for masks for semiconductor lithography, comprising:
an illumination unit configured to guide illumination radiation from a radiation source onto a mask;
an imaging device for imaging the mask;
an image recording device, in which the imaging device is configured to project a focused image of the mask onto the image recording device for at least one wavelength of illumination radiation that is used to illuminate the mask;
one or more correction bodies comprising one or more optical dispersion media which exhibit a dispersive behavior for at least one subrange of the illumination radiation used for imaging the mask, in which the one or more correction bodies are arranged in a light path between the radiation source and the mask, and the one or more correction bodies do not contribute to a desired imaging effect of the imaging device; and
means for controllably influencing the dispersive behavior of at least one of the one or more correction bodies.

28. The inspection device of claim 27, further comprising means for actively influencing the dispersive behavior of at least one of the one or more correction bodies.

* * * * *